(12) United States Patent
Zhou et al.

(10) Patent No.: US 8,741,511 B1
(45) Date of Patent: Jun. 3, 2014

(54) DETERMINATION OF LITHOGRAPHY TOOL PROCESS CONDITION

(71) Applicant: GlobalFoundries Singapore Pte. Ltd., Singapore (SG)

(72) Inventors: Wenzhan Zhou, Singapore (SG); Qun Ying Lin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/720,879

(22) Filed: Dec. 19, 2012

(51) Int. Cl.
*G03F 7/20* (2006.01)

(52) U.S. Cl.
USPC ............................................ 430/30; 430/311

(58) Field of Classification Search
USPC .................................................. 430/30, 311
See application file for complete search history.

(56) References Cited

U.S. PATENT DOCUMENTS

| | | | |
|---|---|---|---|
| 6,363,168 B1 * | 3/2002 | Kakuma | 382/151 |
| 7,747,978 B2 | 6/2010 | Ye et al. | |
| 7,925,369 B2 | 4/2011 | Chauhan et al. | |
| 8,056,028 B2 | 11/2011 | Cao et al. | |

\* cited by examiner

*Primary Examiner* — Christopher Young
(74) *Attorney, Agent, or Firm* — Horizon IP Pte Ltd

(57) ABSTRACT

A method for forming an integrated circuit (IC) is presented. The method includes providing a wafer having a substrate prepared with a photoresist layer. The photoresist layer is processed by passing a radiation from an exposure source of a lithography tool through a mask having a pattern. The process parameters of the lithography tool are determined by performing a pattern matching process. The photoresist layer is developed to transfer the pattern on the mask to the photoresist layer.

21 Claims, 3 Drawing Sheets

DETERMINATION OF LITHOGRAPHY TOOL PROCESS CONDITION

BACKGROUND

Lithographic best condition, such as best focus or best energy, is generally determined by Focus Exposure Matrix (FEM) approach. However, the analysis of FEM (Bossung Curve to ED-windows) requires complicated software code. Thus, extracting the best focus and exposure settings of a lithography tool requires purchase of expensive software to perform automated FEM analysis. Moreover, this solution is difficult to be integrated into inline Statistical Process Control (SPC) or Automated Process Control (APC) system.

From the foregoing discussion, it is desirable to provide a simplified and cost saving method to determine the process condition of a lithography tool. It is also desirable to provide a method to determine the process condition of a lithography tool which can be integrated into inline SPC or APC system.

SUMMARY

Embodiments generally relate to devices, for example, semiconductor devices or integrated circuits (ICs) and method for forming an IC. In one embodiment, the method includes providing a wafer having a substrate prepared with a photoresist layer. The photoresist layer is processed by passing a radiation from an exposure source of a lithography tool through a mask having a pattern. The process parameters of the lithography tool are determined by performing a pattern matching process. The photoresist layer is developed to transfer the pattern on the mask to the photoresist layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, for example, semiconductor devices or integrated circuits (ICs) and method for forming an IC. The ICs can be any type of IC, such as dynamic or static random access memories, signal processors, microcontrollers or system-on-chip (SoC) devices. The devices or ICs can be incorporated into or used with, for example, consumer electronic products, such as computers, cell phones, and personal digital assistants (PDAs).

The fabrication of ICs involves the formation of features on a substrate that make up circuit components, such as transistors, resistors and capacitors. The devices are interconnected, enabling the IC to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, transferring the pattern of the reticle to the photoresist, creating a photoresist etch mask. An etch is performed using the etch mask to replicate the pattern on the wafer below, which may include one or more delayers, depending on the stage of process. In the formation of an IC, numerous reticles may be used for different patterning processes. Furthermore, a plurality of ICs are formed on the wafer in parallel.

Figure 1:
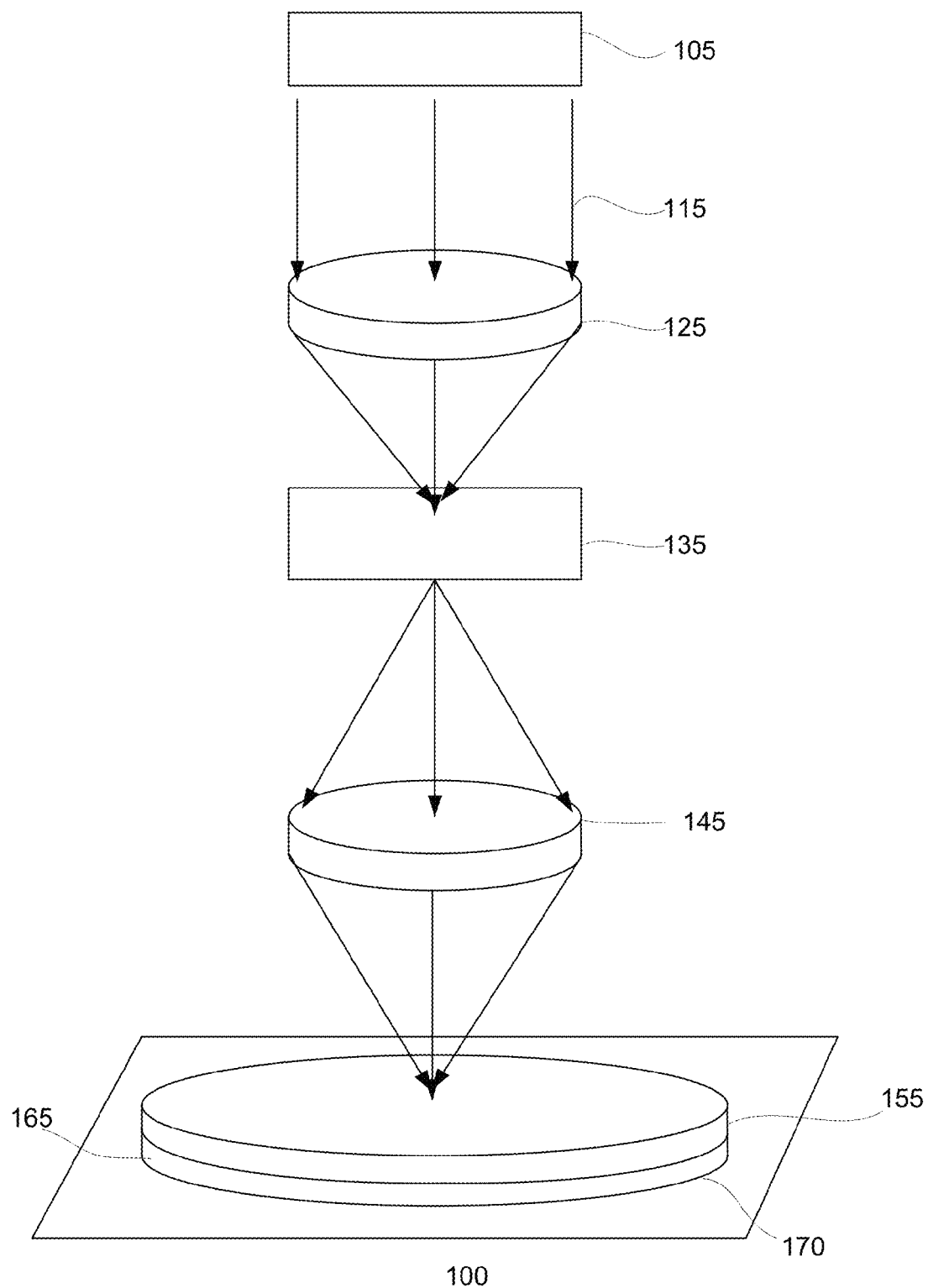
FIG. 1 shows an example of a portion of a lithography tool used for processing a wafer.

FIG. 1 shows an example of a portion of a lithography tool 100 used for patterning a wafer to form features, such as circuit components. The lithography tool, as shown, includes an exposure source 105. A radiation beam 115 is emitted by the exposure source which passes through a condenser 125, and is projected onto a reticle 135. The reticle, for example, includes a pattern corresponding to features of one layer in an IC design. The condenser, for example, may include optical lenses, mirrors, and apertures, such as slits, for the purpose of controlling and directing the radiation beam onto a defined area of the reticle.

The radiation beam carries information such as the patterns formed on the reticle. The resulting patterns are imaged onto a mask layer 155 formed over a substrate 165 of a wafer 170 by an optical projection system 145. The optical projection system, for example, may include mirrors, lenses, filters, apertures, and other optical devices for directing the radiation beam onto the mask layer. Depending on the stage of processing, the substrate can be a bare substrate or include one or more device layers. The mask layer, for example, includes a resist layer. An antireflective coating (ARC) may be provided underneath the resist layer. The exposure source illuminates the resist layer, exposing it with the patterns on the reticle. The resist layer is then developed to expose portions of the underlying layer, which are removed by etching while unexposed portions are protected by the mask and remain intact, creating the patterns on the substrate of the wafer.

The process condition, such as the exposure or the focus settings of the lithography tool, in one embodiment, is determined by a method as will be described below. The pattern of the reticle may be used to manufacture the desired features of an IC device. Additional processing steps may be performed to complete the formation of the IC device. The wafer is singulated to form individual dies or ICs.

Figure 2:
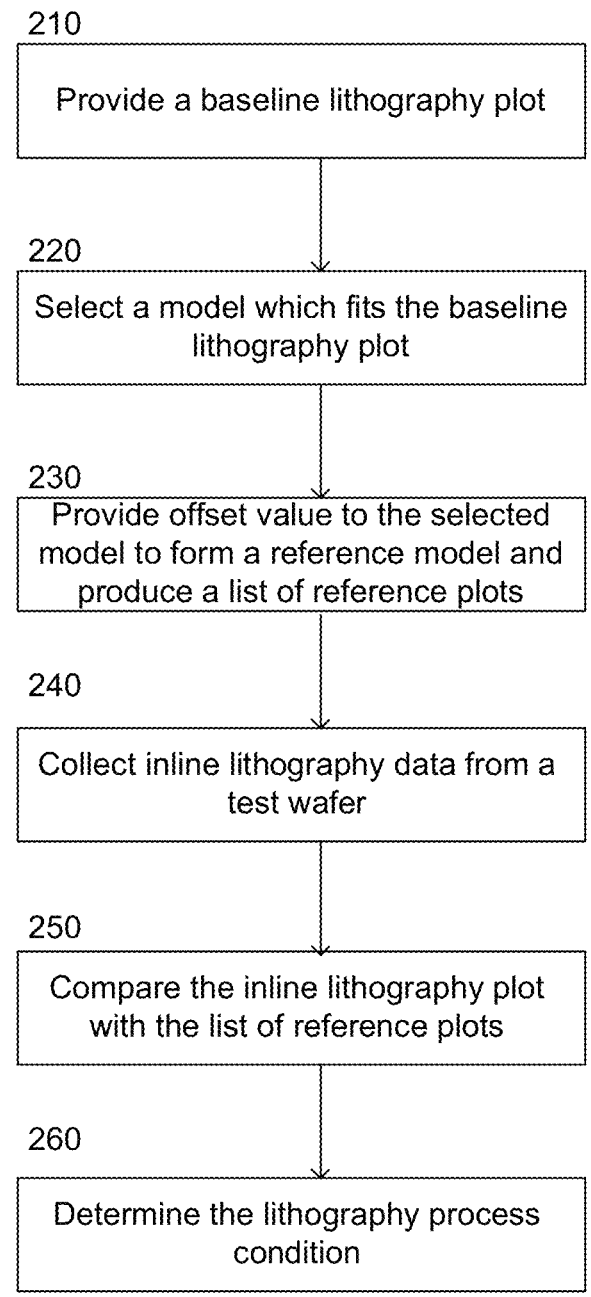
FIG. 2 shows a flow chart of a portion of an embodiment of a method for forming a device.

FIG. 2 shows a portion of an embodiment of a method for forming a device 200. Particularly, FIG. 2 shows a method for determining the process condition or parameters of a lithography tool. The method utilizes a pattern matching technique or process to determine the process or exposure conditions or parameters for a lithography tool.

The process begins by providing a baseline lithography plot at step 210. The baseline lithography plot serves as a baseline plot. The baseline lithography plot is based on, for example, baseline lithography data. The baseline lithography data may be obtained from a baseline wafer. The baseline wafer, for example, may be a golden wafer. A golden wafer, for example, refers to the wafer which provides the best yield. Providing baseline lithography data from other wafers may also be useful. A wafer which provides high or satisfactory yield, for example, may be selected as the baseline wafer. The baseline lithography data, in one embodiment, relates to the stepper focus and exposure settings of a lithography tool which operates at an ideal or optimum condition. Other types of data which can correlate to lithography process parameters and can be modeled may also be useful.

The baseline wafer, for example, includes a plurality of dies, each one of which corresponds to one of the exposure areas. Each of the exposure areas in the matrix has an incrementally different focus (F) and/or an incrementally different exposure (E) than any of the surrounding exposure areas. For example, the focus may be varied along a first axis while the exposure is varied along a second axis orthogonal to the first axis. The different focus and exposure settings of the respective exposure areas of the baseline wafer are, for example provided by a supplier, or extracted from a database.

The individual exposure areas, for example, are examined to determine feature parameters of the resultant pattern formed on the respective exposure areas of the baseline wafer. The feature parameters, for example, may include critical dimension (CD) or linewidth, sidewall angle or height. Other feature parameters, such as feature parameter of which its relationship with lithography parameters can be modeled, may also be useful. For illustration, the feature parameter, in one embodiment, is the CD. The CD, for example, may be measured by a CD measurement machine, such as a CD Scanning Electron Microscopy (CD-SEM). Other suitable types of tools for measuring the CD may also be useful.

The measured CD, focus and exposure data of the respective exposure areas of the baseline wafer are presented as a Focus Exposure Matrix (FEM). The FEM, in one embodiment, may be visualized or presented using a Bossung plot. The Bossung plot typically plots CD vs. focus position for varying levels of exposure. For example, the first or Y axis of the Bossung plot represents the CD measurements and second or X axis represents the focus position while the varying levels of exposure are plotted as contour lines. Alternatively, the Bossung plot may plot exposure vs. focus for varying values of CD. For instance, the values of CD are plotted as contour lines with exposure representing the first or Y axis and focus position representing the second or X axis of the Bossung plot. In one embodiment, the baseline lithography data is presented as the baseline Bossung plot with the varying levels of exposure plotted as contour lines with CD representing the Y axis and focus positions representing the X axis. The baseline lithography data and the baseline Bossung plot, for example, are stored in a database.

At step 220, a model which best describes or fits the baseline Bossung plot is selected. In one embodiment, the model may be described using an equation. The model, in one embodiment, correlates one or more feature parameters as a function of one or more process parameters. For example, the model includes a single feature parameter as a function of a single process parameter or a single feature parameter as a function of more than one process parameters. For example, the model includes CD as a function of focus or exposure (CD$f$(F) or CD$f$(E)) or CD as a function of focus and exposure (CD$f$(F,E)). Other types of models, such as height as a function of focus and exposure (H$f$(F,E)) or sidewall angle as a function of focus and exposure (SA$f$(F,E)), may also be useful. In one embodiment, the selected model is represented in the form of $$CD=MackCDmodel(E,F).$$

The selected model may also be represented in other forms.

At step 230, offset values are provided to the selected model above. For example, a first offset value $\Delta E$ for the exposure and a first offset value $\Delta F$ for the focus are added to the selected model above to form a reference model. In one embodiment, the reference model is represented in the form of:

$$CD=MackCDmodel(E+\Delta E, F+\Delta F).$$

Figure 3:
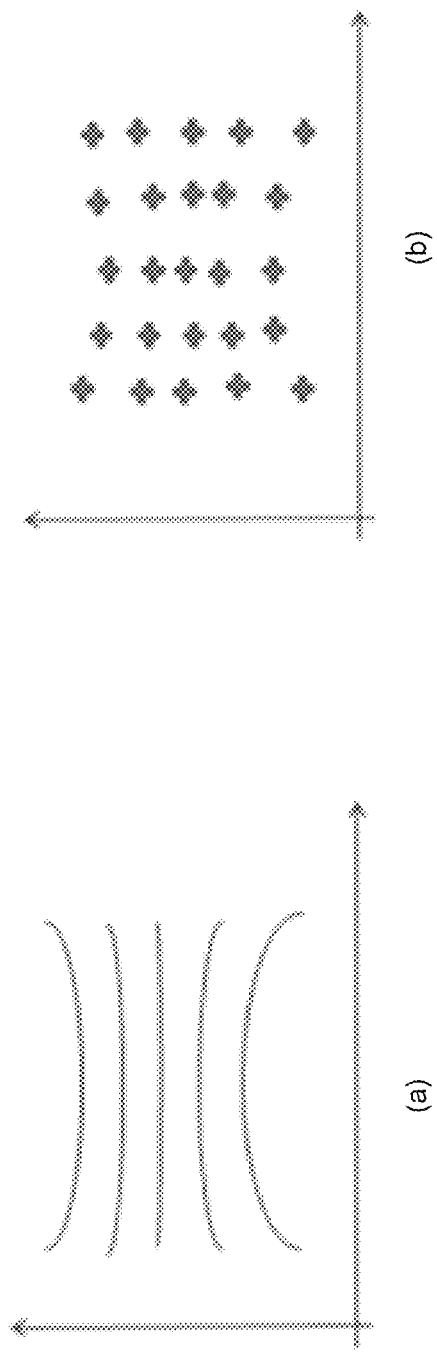
FIG. 3a shows an embodiment of a reference Bossung plot.
FIG. 3b shows a measured lithography data of a test wafer processed by a lithography tool of interest being presented as a Focus Exposure Matrix (FEM)
FIG. 3c shows an example of a reference Bossung plot which best matches the FEM or Bossung plot of the test wafer.
Figure 3:
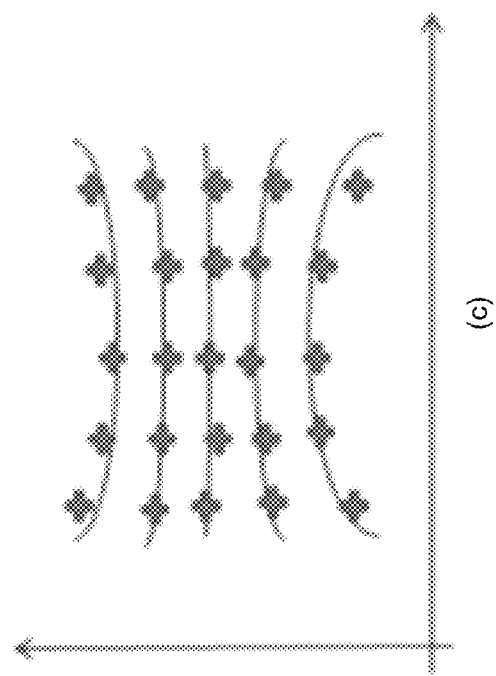

Based on the reference model above, a first reference plot is created. The first reference plot may be visualized or presented using a Bossung plot. An example of the first reference Bossung plot is shown in FIG. 3$a$. As shown, the first reference Bossung plot may be shifted above or below relative to the baseline Bossung plot. This step may be repeated by providing second set of offset values to the selected model to produce second or more reference Bossung plots until a library or list of reference Bossung plots are created and stored in the database.

During inline or monitoring of production of wafers, a wafer from a lot of wafer processed by a lithography tool of interest is selected. The selected wafer, for example, may be referred to as a test wafer. At step 240, inline lithography data from the test wafer is collected. The lithography data, in one embodiment, relates to the focus and exposure settings of the lithography tool used for processing the test wafer. Other types of data tie to other lithography process parameters may also be useful. The individual exposure areas of the test wafer, for example, are examined to determine feature parameters of the resultant pattern formed on the respective exposure areas of the test wafer. The feature parameters, for example, may include critical dimension (CD) or linewidth, sidewall angle or height. Other feature parameters may also be useful. For illustration, the feature parameter of the test wafer, in one embodiment, is the CD. The CD, for example, may be measured by a CD measurement machine, such as CD-SEM. Other suitable types of tools for measuring the CD may also be useful.

The measured CD, focus and exposure data of the respective exposure areas of the test wafer processed by the lithography tool of interest is presented as a Focus Exposure Matrix (FEM) as shown in FIG. 3$b$. Regression, for example, is performed on the measured CD, focus, and exposure data of the test wafer while other parameters are held fixed. The FEM of the test wafer, for example, may be visualized as a Bossung plot. The Bossung plot typically plots CD vs. focus position for varying levels of exposure. For illustration, the first or Y axis of the Bossung plot represents the CD measurements of the test wafer and second or X axis represents the focus position while the varying levels of exposure are plotted as contour lines. Presenting the measured lithography data of the test wafer in other configuration is also useful. The lithography data and the Bossung plot of the test wafer, for example, are stored in the database.

At step 250, the process continues by comparing the inline FEM or the Bossung plot of the test wafer to each of the reference Bossung plots stored in the database. For example, the FEM or Bossung plot of the test wafer is compared to the first reference Bossung plot. If the first reference Bossung plot does not substantially match with the FEM or Bossung plot of the test wafer, the process continues to search for additional reference Bossung plots until a reference Bossung plot which best matches the FEM or Bossung plot of the test wafer is found. Such comparison step is performed by regression using software such as Excel. Other types of statistic software may also be used. In one embodiment, the reference Bossung plot which best matches the FEM or Bossung plot of the test wafer refers to the reference Bossung plot which exhibits the lowest fitting error as shown in FIG. 3c.

Once the closest matching reference Bossung plot is identified, the offset values of the reference Bossung plot may then be extracted. For example, the offset values for the focus and exposure settings of the lithography tool of interest are extracted from the closest matching reference Bossung plot. Thus, the real lithography parameters of the lithography tool of interest is determined by adding these offset values of the test wafer to the lithography parameters of the baseline wafer at step 260.

The method as described with respect to FIG. 2 above results in advantages. The method avoids the use of complicated software code for FEM analysis. The method also provides a cost saving solution since software to perform automated FEM analysis to extract the best process condition of a lithography tool is no longer required. This method which utilizes a pattern matching technique or process simplifies the method to determine the process conditions of a lithography tool and can be easily implemented in the inline process control SPC and APC system. For example, once the offset values are identified, these values can be plotted into SPC or used as an APC feedback parameter. Moreover, the method also allows the use of goodness of fit as an index of whether the shape or profile of the FEM or Bossung plot of the test wafer matches well with the shape or profile of the baseline Bossung plot. In situation where the two plots fail to match well, an alarm system may be activated such that further investigation may be performed on the lithography tool or process drift. As such, this method also provides a reliable fault detection approach, particularly when the FEM or Bossung plot of the test wafer fails to substantially match with the baseline Bossung plot.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming an integrated circuit (IC) comprising:
    providing a wafer having a substrate prepared with a photoresist layer;
    processing the photoresist layer by passing a radiation from an exposure source of a lithography tool through a mask having a pattern, wherein process parameters of the lithography tool which is used to process the photoresist layer is determined by performing a pattern matching process; and
    developing the photoresist layer to transfer the pattern on the mask to the photoresist layer.

2. The method of claim 1 wherein the pattern matching process comprises:
    providing a baseline lithography plot;
    selecting a model which describes the baseline lithography plot;
    forming a list of reference plots;
    providing inline lithography plot;
    comparing the inline lithography plot with the list of reference plots; and
    selecting a reference plot from the list of reference plots which best matches the inline lithography plot.

3. The method of claim 2 wherein providing the baseline lithography plot comprises:
    collecting baseline lithography data from a baseline wafer; and
    presenting the baseline lithography data in a Bossung plot, wherein the Bossung plot serves as the baseline lithography plot.

4. The method of claim 3 wherein the baseline wafer comprises a golden wafer.

5. The method of claim 4 wherein the baseline lithography data relates to one or more process parameters of a lithography tool which operates at an optimum condition.

6. The method of claim 5 wherein the selected model is described using an equation which correlates a feature parameter as a function of the one or more process parameters of the lithography tool which operates at the optimum condition.

7. The method of claim 6 wherein the feature parameter comprises critical dimension (CD), sidewall angle or height of a feature formed on the golden wafer and the one or more process parameters comprise stepper focus or exposure settings of the lithography tool which operates at the optimum condition.

8. The method of claim 6 wherein the selected model is presented in the form of CD=MackCDmodel(E,F).

9. The method of claim 2 wherein forming the list of reference plots comprises:
    forming a reference model based on the selected model; and
    creating one or more reference Bossung plots by providing one or more sets of offset values to the reference model, wherein the one or more reference Bossung plots serve as the list of reference plots.

10. The method of claim 9 wherein the reference model is presented in the form of CD=MackCDmodel(E+ΔE, F+ΔF).

11. The method of claim 2 wherein providing inline lithography plot comprises:
    collecting inline lithography data; and
    presenting the inline lithography data in a Bossung plot, wherein the Bossung plot serves as the inline lithography plot.

12. The method of claim 11 wherein the inline lithography data is collected from the wafer.

13. The method of claim 12 wherein the inline lithography data relates to one or more process parameters of the lithography tool used to process the photoresist layer.

14. The method of claim 2 further comprising:
    extracting offset values from the reference plot which best matches the inline lithography plot; and
    adding the extracted offset values to baseline lithography data to determine the process parameters of the lithography tool used to process the photoresist layer.

15. A method for determining process parameters of a lithography tool used for processing a wafer comprising:
    performing a pattern matching process using a plurality of patterns, wherein the patterns comprise a plurality of lithography plots which are presented to show the relationship of a feature parameter as a function of one or more process parameters of a lithography tool to determine the process parameters of the lithography tool used for processing the wafer.

16. The method of claim 15 wherein performing the pattern matching process comprises:
    providing a baseline lithography plot;
    selecting a model which describes the baseline lithography plot;

forming a list of reference plots;

providing inline lithography plot;

comparing the inline lithography plot with the list of reference plots; and selecting a reference plot from the list of reference plots which best matches the inline lithography plot.

17. The method of claim 16 wherein providing the baseline lithography plot comprises:

collecting baseline lithography data from a baseline wafer; and presenting the baseline lithography data in a Bossung plot, wherein the Bossung plot serves as the baseline lithography plot.

18. The method of claim 17 wherein the baseline wafer comprises a golden wafer.

19. The method of claim 18 wherein the baseline lithography data relates to one or more process parameters of a lithography tool which operates at an optimum condition.

20. The method of claim 19 wherein the selected model is described using an equation which correlates a feature parameter as a function of the one or more process parameters of the lithography tool which operates at the optimum condition.

21. A method for forming an integrated circuit (IC) comprising:

providing a wafer having a substrate prepared with a photoresist layer;

processing the photoresist layer by passing a radiation from an exposure source of a lithography tool through a mask having a pattern, wherein process parameters of the lithography tool is determined by performing a pattern matching process, and wherein the pattern matching process comprises providing a baseline lithography plot;

selecting a model which describes the baseline lithography plot;

forming a list of reference plots;

providing inline lithography plot;

comparing the inline lithography plot with the list of reference plots; and selecting a reference plot from the list of reference plots which best matches the inline lithography plot; and developing the photoresist layer to transfer the pattern on the mask to the photoresist layer.

\* \* \* \* \*